(12) United States Patent
Li et al.

(10) Patent No.: US 11,056,184 B2
(45) Date of Patent: Jul. 6, 2021

(54) STATIC MEMORY BASED ON COMPONENTS WITH CURRENT-VOLTAGE HYSTERESIS CHARACTERISTICS

(71) Applicant: Tsinghua University, Beijing (CN)

(72) Inventors: Xueqing Li, Beijing (CN); Hongtao Zhong, Beijing (CN); Huazhong Yang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 16/926,303

(22) Filed: Jul. 10, 2020

(65) Prior Publication Data
US 2021/0012833 A1    Jan. 14, 2021

(30) Foreign Application Priority Data
Jul. 11, 2019 (CN) .......................... 201910626167.1

(51) Int. Cl.
*G11C 11/419* (2006.01)
*G11C 11/412* (2006.01)
*H01L 27/11* (2006.01)

(52) U.S. Cl.
CPC .......... *G11C 11/419* (2013.01); *G11C 11/412* (2013.01); *H01L 27/1104* (2013.01); *H01L 27/1116* (2013.01)

(58) Field of Classification Search
CPC ....... G11C 11/419; G11C 11/412; G11C 8/16; G11C 7/1075; G11C 11/2253; G11C 11/2273; G11C 11/2275; G11C 11/2259; G11C 11/223; G11C 11/413; H01L 27/1104; H01L 27/1116; H01L 27/1159; H01L 29/516
USPC ................................... 365/154, 205
See application file for complete search history.

(56) References Cited

U.S. PATENT DOCUMENTS

| | | | | |
|---|---|---|---|---|
| 5,245,582 A * | 9/1993 | Kimura | .................... | G11C 7/22 235/441 |
| 5,625,593 A * | 4/1997 | Kimura | .................. | G11C 5/143 235/441 |
| 5,684,997 A * | 11/1997 | Kau | ........................ | G06F 13/24 710/260 |
| 6,493,787 B1 * | 12/2002 | Yamamoto | ............ | G06F 3/0617 711/100 |

(Continued)

*Primary Examiner* — Michael T Tran
(74) *Attorney, Agent, or Firm* — Hodgson Russ LLP

(57) ABSTRACT

The present disclosure discloses an SRAM cell circuit and an SRAM array circuit. The cell circuit includes a data storage module, a write operation module, and a read operation module. The data storage module consists of the component with the current-voltage hysteresis characteristic and is configured to store data with the current-voltage hysteresis characteristic. The data storage module includes a write operation port and a read operation port, and the data information stored in the data storage module may change without external energy input. The write operation module is coupled to the write operation port and is configured to perform write operation on the stored information. The write operation module ensures the stored information unchanged by continuously controlling the write operation port while not changing the stored information. The read operation module is coupled to the read operation port and configured to perform read operation on the stored information.

10 Claims, 3 Drawing Sheets

(56) References Cited

U.S. PATENT DOCUMENTS

| | | | |
|---|---|---|---|
| 6,542,955 B1* | 4/2003 | Chen | G06F 9/30043 |
| | | | 711/102 |
| 6,799,223 B1* | 9/2004 | Yamamoto | H04L 29/06 |
| | | | 348/E7.069 |
| 7,656,755 B2* | 2/2010 | Sugiyama | G11B 27/002 |
| | | | 369/30.05 |
| 8,683,308 B2* | 3/2014 | Tsukamoto | G06F 11/10 |
| | | | 714/799 |
| 9,594,611 B2* | 3/2017 | Hashimoto | G06F 3/0616 |
| 10,146,449 B1* | 12/2018 | Labonte | G06F 3/0683 |
| 2004/0058714 A1* | 3/2004 | Sawamura | H04N 1/00307 |
| | | | 455/566 |
| 2009/0327357 A1* | 12/2009 | Beglin | G06F 16/1873 |
| 2011/0317478 A1* | 12/2011 | Chan | G11C 11/419 |
| | | | 365/156 |
| 2012/0195111 A1* | 8/2012 | Ramaraju | G11C 8/16 |
| | | | 365/156 |
| 2016/0070653 A1* | 3/2016 | Shen | G06F 12/1027 |
| | | | 711/206 |
| 2016/0239207 A1* | 8/2016 | Takakura | G06F 3/0661 |
| 2016/0240244 A1* | 8/2016 | Shankar | G11C 11/419 |
| 2017/0351632 A1* | 12/2017 | Shaw, II | G06F 13/1694 |
| 2018/0217758 A1* | 8/2018 | Wang | G11C 16/22 |
| 2019/0121572 A1* | 4/2019 | Zhou | G06F 3/0679 |
| 2019/0294373 A1* | 9/2019 | Lee | G06F 3/0604 |
| 2019/0334837 A1* | 10/2019 | Fairhurst | H04L 47/2433 |
| 2020/0066325 A1* | 2/2020 | Kang | G11C 11/4087 |

\* cited by examiner (a) Structure of Anti-FeFET (b) Circuit model of Anti-FeFET (c) polarization characteristic of Anti-FeFET (d) $I_D$-$V_G$ characteristic of Anti-FeFET

STATIC MEMORY BASED ON COMPONENTS WITH CURRENT-VOLTAGE HYSTERESIS CHARACTERISTICS

CROSS-REFERENCE TO RELATED APPLICATION

This application claims priority to Chinese Patent Application No. 201910626167.1, filed Jul. 11, 2019, the entire disclosure of which is incorporated herein by reference.

FIELD

The present disclosure mainly relates to a field of low-power memory design and high-integration static memory design, and more particularly to a static memory based on a component with a current-voltage hysteresis characteristic.

BACKGROUND

With the rising of artificial intelligence and big data, the amount of data processing is increasing day by day. The large amount of data needs a support of a memory with high performance. The performance of the memory is determined by factors such as the storage capacity, the reading and writing speed, power consumption of the memory. Depending on the applications, any factor may seriously reduce the performance of the memory.

An SRAM (Static Random Access Memory) is a kind of random access memory with a special structure to support the static storage of the memory data. Comparing with a DRAM (Dynamic Random Access Memory), the SRAM does not need to refresh, and data stored in the SRAM may not be lost as long as a power supply is maintained. In practice, the SRAM implemented in the CMOS (Complementary Metal-Oxide Semiconductor) technology has advantages of being refresh-free, as well as other advantages such as a fast reading and writing speed. Therefore, CMOS-based SRAM has been also widely used in a cache. However, the SRAM also has its own insuperable disadvantages. Since a cell circuit of the SRAM needs more transistors, to store the same amount of information, SRAM needs a larger area than the conventional DRAM technology, and is thus more expensive. More importantly, CMOS-based SRAM consumes standby power in the idle state, and has become the major power consumption source in many data-intensive applications. Nowadays, with the reduction of the transistor size, the leakage problem becomes more and more serious, and improving the energy efficiency is becoming more challenging. Lower integration has also caused that the SRAM may not be used as the basic cell in a main memory which is optimized for density.

The CMOS-based SRAM belongs to the type of volatile memory: when the power supply is removed and restored, the data stored in the SRAM may be lost. In contrast, data stored in a non-volatile memory may not be lost after the power supply is interrupted. However, the existing non-volatile memory also has disadvantages, such as high operation complexity, high power consumption, longer operation delay, and lower component endurance, which limit the application of the non-volatile memory.

SUMMARY

The present disclosure aims to solve one of the technical problems in the related art to at least some extent.

For this, one objective of the present disclosure is to provide a cell circuit of a static memory based on a type of component with a current-voltage hysteresis characteristic. The present static memory could maintain data at a low voltage with low power consumption and has high storage density.

The other objective of the present disclosure is to provide an array circuit including a plurality of memory cells.

To achieve the above objectives, an aspect of embodiments of the present disclosure provides a cell circuit of a static memory based on a component with a current-voltage hysteresis characteristic. The cell circuit includes a data storage module, a write operation module, and a read operation module. The data storage module consists of the component with the current-voltage hysteresis characteristic, and is configured to store information using the current-voltage hysteresis characteristic. The data storage module includes a write operation port and a read operation port, and the information stored in the data storage module may not be kept without external energy input. The write operation module is coupled to the write operation port and is configured to perform write operation on the data stored in the data storage module. The write operation module ensures the information stored in the data storage module unchanged by continuously controlling the write operation port while not changing the information stored in the data storage module. The write operation module does not need to obtain the value of the data (either bit of '0' or bit of '1') stored in the data storage module in advance for controlling the information stored in the data storage module unchanged. The read operation module is coupled to a read operation port and is configured to perform read operation on the data stored in the data storage module.

The cell circuit of the static memory based on the component with the current-voltage hysteresis characteristic according to the embodiments of the present disclosure has the ability to store the data at a low voltage, has a fast reading speed, a high integration level and high endurance, and may effectively eliminate the leakage problem of the SRAM in the idle state, and is a kind of memory that may maintain data under the low voltage, greatly reduce the power consumption and improve storage density.

In addition, the cell circuit of the static memory based on the component with the current-voltage hysteresis characteristic according to embodiments of the present disclosure may further have following additional features.

Further, in an embodiment of the present disclosure, the write operation module is set independently of or integrated with the read operation module.

Further, in an embodiment of the present disclosure, the voltage of the write operation port of the data storage module is manipulated to control the impedance of the read operation port, in which a relationship between the impedance and the voltage has the current-voltage hysteresis characteristic.

To achieve the above objectives, the other aspect of embodiments of the present disclosure provides an array circuit including a plurality of memory cells, in which, at least one of the memory cells adopts the cell circuit of the static memory based on the component with the current-voltage hysteresis characteristic according to the above embodiments.

The array circuit including a plurality of memory cells according to embodiments of the present disclosure has the ability to store the data at a low voltage, has a fast reading speed, a high integration level and high endurance, and may effectively eliminate the leakage problem of the SRAM in the idle state, and is a kind of memory that may maintain data under a low voltage, greatly reduce the power consumption and improve the storage density.

In addition, the array circuit including a plurality of memory cells according to embodiments of the present disclosure may further have following additional features.

Further, in an embodiment of the present disclosure, a plurality of memory cells are arranged in a plurality of rows and a plurality of columns, the memory cells in the same row are coupled by word lines, and the memory cells in the same column are coupled by bit lines, thereby supporting write operation, read operation or proposed data maintaining operation for information in rows or columns.

Further, in an embodiment of the present disclosure, the component with the current-voltage hysteresis characteristic can be a ferroelectric field effect transistor (FeFET), an anti-ferroelectric field effect transistor (Anti-FeFET), a negative-capacitance field effect transistor (NCFET) or a nanometer electromechanical relay (NEM Relay), in which, the gate of FeFET, Anti-FeFET, NCFET or NEM Relay is coupled to the write bit line (WBL) through the first switch, the control signal of the first switch is coupled to the write word line (WWL), the drain or source of FeFET, Anti-FeFET, NCFET or NEM Relay is coupled to the read bit line (RBL) through the second switch, and the control signal of the second switch is coupled to the read word line (RWL).

Further, in an embodiment of the present disclosure, the first switch is implemented by the first transistor, the second switch is implemented by the second transistor, the input port of the first switch is coupled to the drain of the first transistor, the output port of the first switch is coupled to the source of the first transistor, the control signal of the first switch is coupled to the gate of the first transistor, the input port of the second switch is coupled to the drain of the second transistor, the output port of the second switch is coupled to the source of the second transistor, the control signal of the second switch is coupled to the gate of the second transistor.

Further, in an embodiment of the present disclosure, the write bit line and the read bit line are coupled together through an electrical short circuit.

Further, in an embodiment of the present disclosure, when a data maintaining operation is performed, information stored in the data storage module is unchanged, the voltage of the write word line and the voltage sent from the first switch to the data storage module are controlled continuously, such that FeFET, Anti-FeFET, NCFET, or NEM Relay gate voltage stays within the current-voltage hysteresis window, thereby avoiding the information changing; when the write operation is performed, the write word line drives the first switch to make the first switch conducted, and FeFET, Anti-FeFET, NCFET, or NEM Relay gate voltage is manipulated by controlling the voltage of the write bit line, thereby changing the state of the current-voltage hysteresis characteristic of FeFET, Anti-FeFET, NCFET, or NEM Relay; and when the read operation is performed, the read word line drives the second switch to make the second switch conducted, thereby obtaining the information by the impedance characteristic of FeFET, Anti-FeFET, NCFET, or NEM Relay.

Additional aspects and advantages of embodiments of the present disclosure will be given in part in the following descriptions, and become apparent in part from the following descriptions, or be learned from the practice of the embodiments of the present disclosure.

BRIEF DESCRIPTION OF THE DRAWINGS

The above and/or additional aspects and advantages of the present disclosure will become apparent and more readily appreciated from the following descriptions made for embodiments with reference to the accompanying drawings, in which.

DETAILED DESCRIPTION

Description will be shown in detail below according to embodiments of the present disclosure. Examples of embodiments are illustrated in the accompanying drawings, in which, the same or similar numbers represent the same or similar elements or elements with the same or similar functions. Embodiments described below with reference to the accompanying drawings are exemplary, which are intended to explain the present disclosure and should not be understood as a limitation of the present disclosure.

A cell circuit and an array circuit of a static memory based on a component with a current-voltage hysteresis characteristic according to embodiments of the present disclosure will be described below with reference to the accompanying drawings. Firstly, the cell circuit of the static memory based on the component with the current-voltage hysteresis characteristic according to embodiments of the present disclosure is described with reference to the accompanying drawings.

Figure 1:
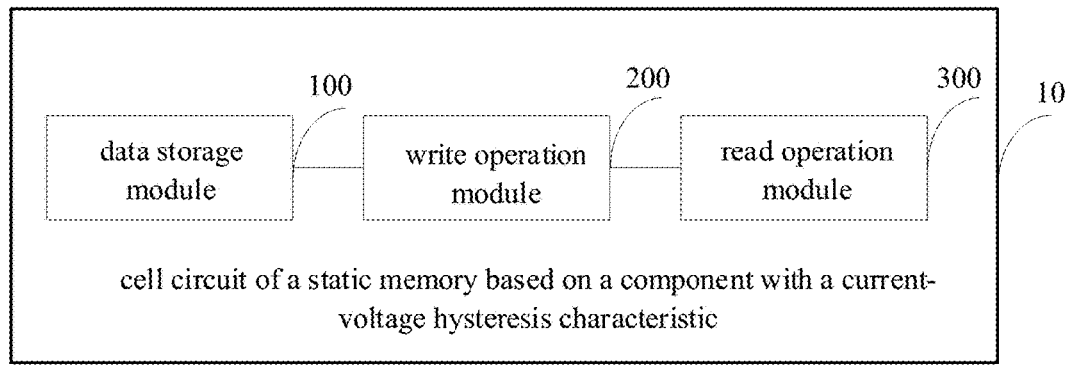
FIG. 1 is a block diagram illustrating a cell circuit of a static memory based on a component with a current-voltage hysteresis characteristic according to embodiments of the present disclosure.

FIG. 1 is a block diagram illustrating a cell circuit of a static memory based on a component with a current-voltage hysteresis characteristic according to embodiments of the present disclosure.

As illustrated in FIG. 1, the cell circuit 10 of the static memory based on the component with the current-voltage hysteresis characteristic includes: a data storage module 100, a write operation module 200, and a read operation module 300.

The data storage module 100 consists the component with the current-voltage hysteresis characteristic, and is configured to store information using the current-voltage hysteresis characteristic. The data storage module includes a write operation port and a read operation port, and data stored in the data storage module may change without an external energy input. The write operation module 200 is coupled to the write operation port, and is configured to perform write operation on the information stored in the data storage module 100. When the write operation module 200 does not change the stored data, the write operation module 200 ensures the information stored in the data storage module unchanged by continuously controlling the write operation port, and the write operation module 200 does not need to obtain the state of the data stored in the data storage module in advance for controlling the data stored in the data storage module unchanged. The read operation module 300 is coupled to a read operation port, and is configured to perform read operation on the state of data stored in the data storage module. The cell circuit 10 of the static memory according to embodiments of the present disclosure has advantages such as a high integration level and high endurance, and is a type of memory that can maintain data under a low voltage, greatly reduce the power consumption and improve the storage density.

In an embodiment of the present disclosure, the write operation module 200 is set independently of the read operation module 300, or is integrated with the read operation module 300.

In detail, the data storage module 100 mainly consists of the component with the current-voltage hysteresis characteristic, and stores data with the current-voltage hysteresis characteristic. The data storage module 100 includes the write operation port and the read operation port, and the stored data may change without the external energy input. The write operation module 200 is coupled to the write operation port of the data storage module 100, and controls the data stored in the data storage module. The write operation module 200 may continuously control the write operation port to avoid the data stored in the data storage module changing while not changing the data stored in the data storage module 100. The above operation does not need to obtain the data stored in the data storage module 100 in advance. The read operation module 300 is coupled to the read operation port of the data storage module 100, and obtains the data stored in the data storage module 100 during a read operation.

Further, in an embodiment of the present disclosure, the voltage of the write operation port of the data storage module 100 is manipulated to control the impedance of the read operation port, in which the relationship between the impedance and the voltage has the current-voltage hysteresis characteristic.

In detail, the voltage of the write operation port of the data storage module 100 controls the impedance of the read operation port of the data storage module 100. The relationship between the impedance and the voltage has the current-voltage hysteresis characteristic. The write operation module 200 controls the data stored in the data storage module 100 by changing the voltage of the write operation port of the data storage module 100, and avoids the change of the data stored in the data storage module 100 by continuously controlling the write operation port. The operation may not need to obtain the data information stored in the data storage module 100 in advance. The read operation module 300 obtains the data stored in the data storage module 100 by reading the impedance of the read operation port of the data storage module 100.

Further, in an embodiment of the present disclosure, the data storage module 100 may be implemented by utilizing a FeFET, Anti-FeFET, NCFET or NEM Relay. The impedance between the drain and the source of the transistor is controlled by the voltage between the gate and the substrate or the source with hysteresis characteristic.

In detail, the gate of FeFET, Anti-FeFET, NCFET or NEM Relay is coupled to a write bit line through the first auxiliary transistor or the first switch. The gate of the first auxiliary transistor is coupled to a write word line. The drain of FeFET, Anti-FeFET, NCFET or NEM Relay is coupled to a read bit line through the second auxiliary transistor or the second switch. The gate of the second auxiliary transistor is coupled to a read word line.

When a data maintaining operation is performed, all of the write word line and the read word line could be set to turn off the write access and read access, respectively. The drain of the first auxiliary transistor may be controlled continuously when the first auxiliary transistor does not change the data stored in the data storage module, to avoid the bits of data information stored in FeFET, Anti-FeFET, NCFET or NEM Relay changing. The above operation does not need to obtain the data information stored in FeFET, Anti-FeFET, NCFET or NEM Relay in advance.

When a write operation is performed, the write word line drives the first auxiliary transistor to make it conducted, and FeFET, Anti-FeFET, NCFET or NEM Relay gate voltage is manipulated by controlling the voltage of the write bit line, thereby changing the state of the current-voltage hysteresis characteristic of FeFET, Anti-FeFET, NCFET or NEM Relay.

When the read operation is performed, the read word line drives the second auxiliary transistor to make it conducted, and further, the data information stored in the data storage module is obtained by the impedance characteristic of FeFET, Anti-FeFET, NCFET or NEM Relay.

It should be noted that, design for a structure of the static memory of embodiments of the present disclosure originates from the conventional CMOS-based three-transistor embedded dynamic random-access memory (3T eDRAM). Comparing with the CMOS-based SRAM, the 3T eDRAM has advantages such as no leakage power, no data-fresh operations, high density and simple operation. Comparing with a widely used "one transistor, one capacitor" (1T1C) dynamic random access memory (1T1C DRAM), the 3T eDRAM has advantages such as non-destructive read operation. Presently, such a 3-T structure has been widely used in the embedded system, and these advantages may mostly be achieved by the static memory with a high performance in embodiments of the present disclosure.

In the static memory with the high performance according to embodiments of the present disclosure, a transistor used for storing information in 3T eDRAM is replaced with the component with the current-voltage hysteresis characteristic, such as an Anti-FeFET. Different from FeFET, the Anti-FeFET is usually a volatile component. Although data stored in the Anti-FeFET is easy to be lost during power supply failure, the present disclosure provides the maintaining mechanism to ensure that data is maintained as long as the power supply is stable. In addition, Anti-FeFET has high endurance, such that the static memory with the high performance in embodiments of the present disclosure has a long service life.

Figure 2:
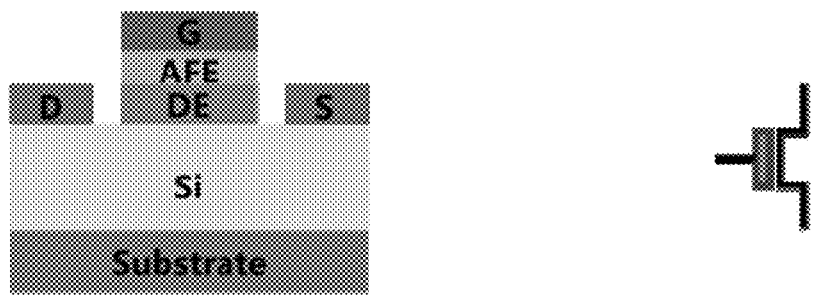
FIG. 2 is a schematic diagram illustrating a three-port component (here given Anti-FeFET as an example) with a current-voltage hysteresis characteristic according to some embodiments of the present disclosure.
Figure 2:
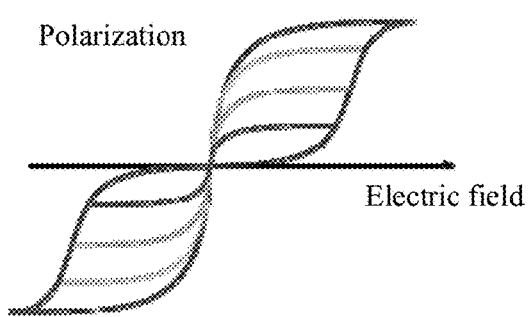
Figure 2:
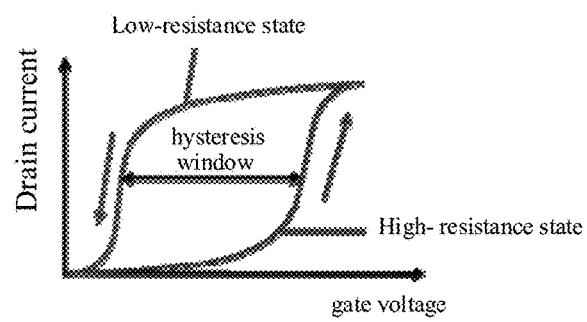

In detail, FIG. 2 illustrates an example of a three-port component with a current-voltage hysteresis characteristic and high endurance, that is, a structure, a circuit model, a polarization characteristic and an ID-VG characteristic of the Anti-FeFET. An array illustrated in FIG. 3 may be built by using the Anti-FeFETs and the conventional metal-oxide semiconductor field effect transistors (MOSFETs).

In embodiments of the present disclosure, the Anti-FeFET is merely an example. In theory, any component with the current-voltage hysteresis characteristic (such as three-terminal or four-terminal NEM Relay, FeFET, etc.) may be also used to build the static memory proposed in the present disclosure.

In a detailed implementation, the write operation module is replaced with a write access transistor (M1), and the read operation module is replaced with a read access transistor (M2). Gates of the write access transistors (M1) in the same row are connected through the write word line (WWL). Drains of the write access transistors (M1) in the same row are connected through the write bit line (WBL). Gates of the read access transistors (M2) in the same row are connected through the read word line (RWL). Drains of the read access transistors (M2) in the same row are connected through the read bit line (RBL).

Figure 3:
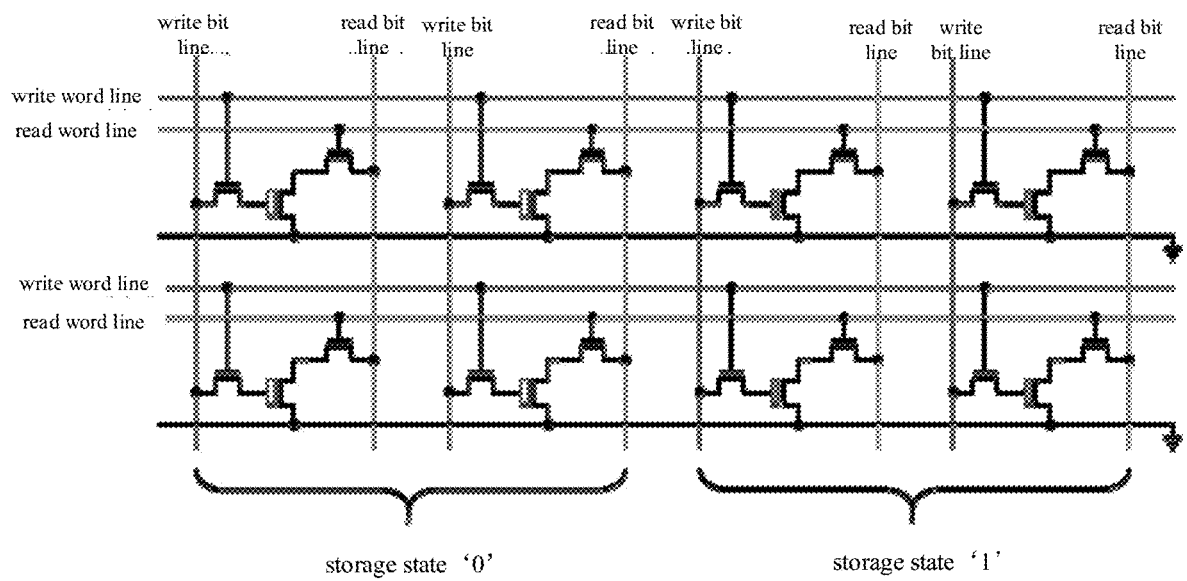
FIG. 3 is a block diagram illustrating a memory array according to a detailed embodiment of the present disclosure.

Detailed description will be made below to three basic operations of the array illustrated in FIG. 3. The three basic operations include: the data maintaining operation, the write operation, and the read operation.

Figure 4:
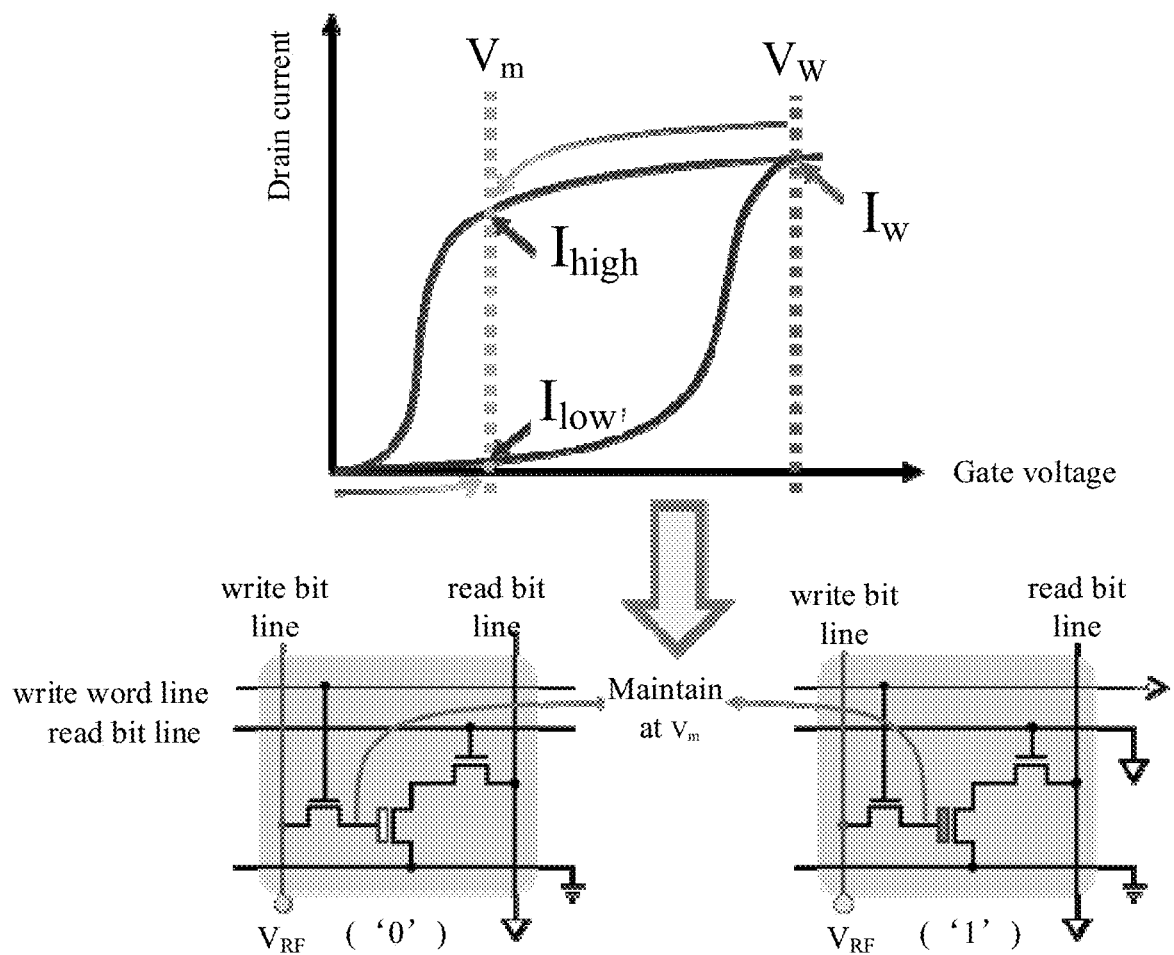
FIG. 4 is a schematic diagram illustrating a detailed implementation of a data maintaining operation according to embodiments of the present disclosure.

FIG. 4 illustrates a detailed implementation of the data maintaining operation. When the voltage at a gate of the Anti-FeFET exceeds a certain positive voltage $V_W$ (a minimum positive voltage required for the Anti-FeFET to enter a low-resistance state from a high-resistance state), a polarization of the Anti-FeFET will be positive, and the Anti-FeFET maintains or transits to the low-resistance state. After the Anti-FeFET state is changed, write access transistors are turned off (i.e., the write word line (WWL) is pulled down to GND), and the write bit line (WBL) is pulled down to a certain voltage $V_{RF}$ (refreshing-free voltage, and $V_{RF} < V_W$). Due to the influence of leakage, charges stored on the gate of the Anti-FeFET in the low-resistance state may gradually leak, and the gate voltage may also gradually decrease. In addition, due to influence of $V_{RF}$, the gate voltage of the Anti-FeFET in the low-resistance state may eventually approach a certain positive maintaining voltage $V_m$, while the gate voltage of the Anti-FeFET in the high-resistance state may eventually be pulled up to a vicinity of $V_m$. $V_{RF}$ needs to ensure that the drain current Imo of the Anti-FeFET in the low-resistance state corresponding to $V_m$ is much larger than a drain current how of the Anti-FeFET in the high-resistance state corresponding to $V_m$, which means that the Anti-FeFET whose original state is the low-resistance state remains in the low-resistance state at this time. Meanwhile, the Anti-FeFET whose original state is the high-resistance state remains in the high-resistance state at this time. According to the hysteretic characteristic of the Anti-FeFET, $I_{high}$ is still much larger than how which enables efficient read operations.

Figure 5:
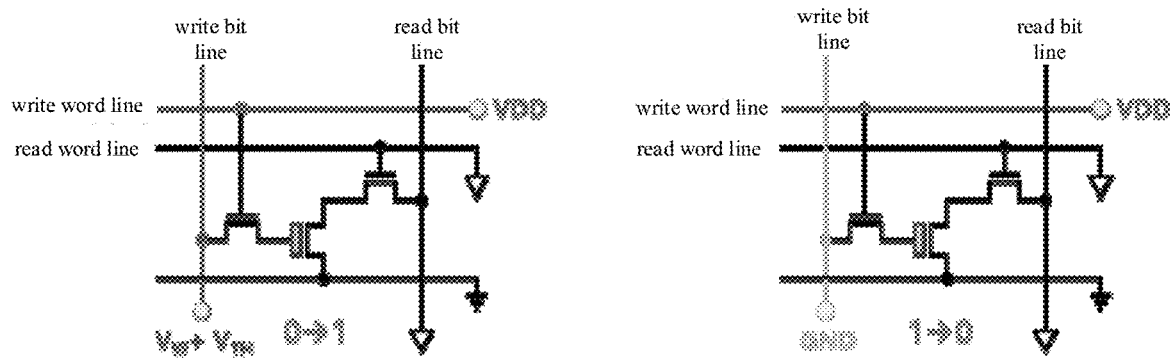
FIG. 5 is a schematic diagram illustrating a detailed implementation of a write operation according to embodiments of the present disclosure.

FIG. 5 illustrates a detailed implementation example of the write operation. For the write operation, firstly, the write word line (WWL) is pulled up to supply voltage (VDD), and the write access transistor (M1) is turned on. When the voltage on the write bit line (WBL) exceeds $V_W + V_m$ ($V_{TH}$ is the threshold voltage drop of the write access transistor), the voltage on the gate of the Anti-FeFET may exceed $V_W$, the polarization of the Anti-FeFET may be changed, and the Anti-FeFET may be changed from the high-resistance state to the low-resistance state, or remain the low-resistance state if the original state of Anti-FeFET is the low-resistance state. At this time, the state of the Anti-FeFET is '1'. When the voltage on the write bit line (WBL) is pulled down to GND (0V), the Anti-FeFET may be changed from the low-resistance state to the high-resistance state, or remain the high-resistance state if the original state of Anti-FeFET is the high-resistance state. At this time, the state of Anti-FeFET is '0'.

Figure 6:
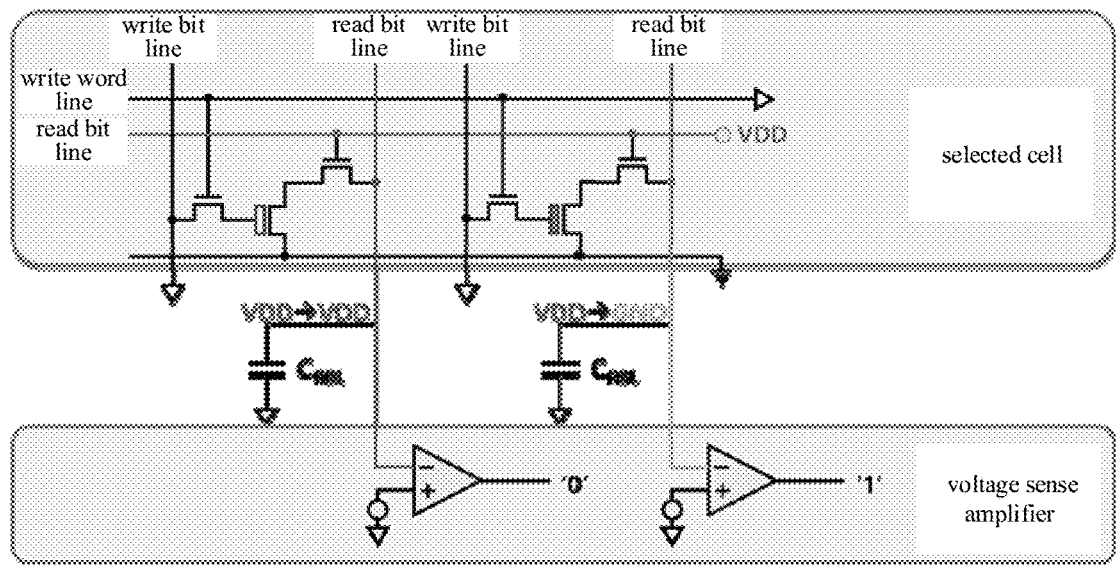
FIG. 6 is a schematic diagram illustrating a detailed implementation of a read operation according to embodiments of the present disclosure.

FIG. 6 illustrates a detailed implementation example of the read operation. For the read operation, firstly, the read bit line (RBL) is pre-charged to a certain voltage value (usually VDD), then the read word line (RWL) is pulled up to VDD, and the read access transistor is turned on. When the Anti-FeFET is in the high-resistance state (state '0'), the read bit line (RBL) may remain in the high level for a period of time. When the Anti-FeFET is in the low-resistance state (state '1'), the read bit line (RBL) will be pulled down to a low voltage level. A voltage sense amplifier can determine the impedance between the source and the drain of the component according to the change of the voltage of the read bit line (RBL), thereby reading the stored information.

In conclusion, the cell circuit of the static memory according to embodiments of the present disclosure not only has a long service life, but also has the capability of storing data at a low voltage. Using the current-voltage hysteresis characteristic of Anti-FeFET, when Anti-FeFET enters the low-resistance state, the current flowing through Anti-FeFET may maintain a high value under the low voltage, such that a bias voltage required for maintaining data may be low and does not need to be as high as a conventional SRAM. Such characteristic makes the reading speed of the static memory at the low voltage in the present disclosure faster than that of the SRAM.

In addition, in a standby idle state, the static memory with the high performance in the present disclosure has almost no leakage. The bias voltage keeps the charge stored in the data storage module almost unchanged. With the special structure, the static memory with the high performance of the present disclosure can greatly improve the leakage problem of SRAM in the idle state.

The cell circuit of the static memory based on the component with the current-voltage hysteresis characteristic according to embodiments of the present disclosure has the ability to store the data at the low voltage, has a fast reading speed, a high integration level and high endurance, and may effectively eliminate the leakage problem of the SRAM in the idle state, and is a kind of memory that may maintain data under the low voltage, greatly reduce power consumption and improve storage density.

An array circuit including a plurality of memory cells according to embodiments of the present disclosure is described with reference to the accompanying drawings.

Figure 7:
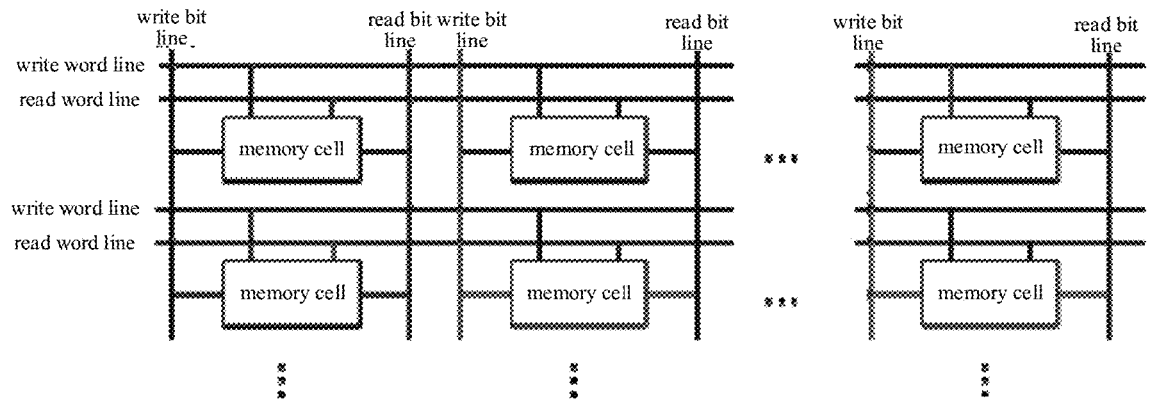
FIG. 7 is a block diagram illustrating an array circuit including a plurality of memory cells according to embodiments of the present disclosure.

FIG. 7 is a block diagram illustrating an array circuit including a plurality of memory cells according to embodiments of the present disclosure.

As illustrated in FIG. 7, in the array circuit including a plurality of memory cells, at least one of the memory cells adopts the cell circuit based on the component with the current-voltage hysteresis characteristic according to the above embodiments.

Further, in an embodiment of the present disclosure, a plurality of memory cells are arranged in a plurality of rows and a plurality of columns, the memory cells in the same row are coupled by word lines, and the memory cells in the same column are coupled by bit lines, thereby supporting write operation, read operation or proposed data maintaining operation for information in rows or columns.

Further, in an embodiment of the present disclosure, the component with the current-voltage hysteresis characteristic is FeFET, Anti-FeFET, NCFET or a NEM Relay, in which, the gate of FeFET, Anti-FeFET, NCFET or NEM Relay is coupled to a write bit line through the first switch, the control signal of the first switch is coupled to a write word line, the drain of FeFET, Anti-FeFET, NCFET or NEM Relay is coupled to a read bit line through the second switch, and the control signal of the second switch is coupled to a read word line.

Further, in an embodiment of the present disclosure, the first switch is implemented by the first transistor, and the second switch is implemented by the second transistor. The input port of the first switch is coupled to the drain of the first transistor, the output port of the first switch is coupled to the source of the first transistor, the control signal of the first switch is coupled to the gate of the first transistor, the input port of the second switch is coupled to the drain of the second transistor, the output port of the second switch is coupled to the source of the second transistor, and the control signal of the second switch is coupled to the gate of the second transistor.

Further, in an embodiment of the present disclosure, the write bit line and the read bit line are coupled together through an electrical short circuit.

Further, in an embodiment of the present disclosure, when a data maintaining operation is performed, the data stored in the data storage module is not changed, the voltage of the write word line and the voltage sending from the first switch to the data storage module are controlled continuously, such that FeFET, Anti-FeFET, NCFET or NEM Relay gate voltage stays within the current-voltage hysteresis window, thereby avoiding the data information changing. When the write operation is performed, the write word line drives the first switch to make it conducted, and FeFET, Anti-FeFET, NCFET or NEM Relay gate voltage is controlled by controlling the voltage of the write bit line, thereby changing the state of the current-voltage hysteresis characteristic of FeFET, Anti-FeFET, NCFET or NEM Relay. When the read operation is performed, the read word line drives the second switch to make it conducted, thereby obtaining the information of the stored data by the impedance characteristic of FeFET, Anti-FeFET, NCFET or NEM Relay.

It should be noted that, the above description for the cell circuit of the static memory based on the component with the current-voltage hysteresis characteristic in the above embodiments may also be applicable to the array circuit including a plurality of memory cells in this embodiment, which is not elaborated herein.

The array circuit including a plurality of memory cells according to embodiments of the present disclosure has the ability to store the data at the low voltage, has a fast reading speed, a high integration level and high endurance, and may effectively improve the leakage problem of the SRAM in the idle state, and is a kind of memory that may maintain data under the low voltage, greatly reduce power consumption and improve storage density.

In addition, the terms "first" and "second" are only for description purpose, and it cannot be understood as indicating or implying its relative importance or implying the number of indicated technology features. Thus, features defined as "first" and "second" may explicitly or implicitly include at least one of the features. In the description of the present disclosure, "a plurality of" means at least two, such as two, three, unless specified otherwise.

In the description of the present disclosure, reference throughout this specification to "an embodiment," "some embodiments," "an example," "a specific example," or "some examples," means that a particular feature, structure, material or characteristic described in connection with the embodiment or example is included in at least one embodiment or example of the present disclosure. The appearances of the phrases in various places throughout this specification are not necessarily referring to the same embodiment or example. Furthermore, the particular feature, structure, material or characteristic may be combined in any suitable manner in one or more embodiments or examples. In addition, without a contradiction, the different embodiments or examples and the features of the different embodiments or examples described in the specification can be combined by those skilled in the art.

Although embodiments of the present disclosure have been shown and described above, it should be understood that the above-mentioned embodiments are exemplary and should not be construed as limiting the present disclosure. The skilled in the art can make changes, modifications, substitutions and variations to the above-mentioned embodiments within the scope of the present disclosure.

What is claimed is:

1. A cell circuit of a static memory based on a component with current-voltage hysteresis characteristic, comprising:
    a data storage module, wherein the data storage module consists of the component with the current-voltage hysteresis characteristic and is configured to store data information using the current-voltage hysteresis characteristic, the data storage module comprises a write operation port and a read operation port, and the data information stored in the data storage module may change without external energy input;
    a write operation module, wherein the write operation module is coupled to the write operation port and is configured to perform write operation on the data information stored in the data storage module, and to ensure the data information stored in the data storage module is unchanged by continuously controlling the write operation port while not changing the data information stored in the data storage module, in which the write operation module does not need to obtain the data information stored in the data storage module in advance for controlling the data information stored in the unchanged data storage module; and
    a read operation module, coupled to the read operation port and configured to perform read operation on the information stored in the data storage module.

2. The cell circuit of claim 1, wherein the write operation module is set independently of or integrated with the read operation module.

3. The cell circuit of claim 1, wherein the voltage of the write operation port of the data storage module is controlled to control the impedance of the read operation port, in which the relationship between the impedance and the voltage has the current-voltage hysteresis characteristic.

4. An array circuit comprising a plurality of memory cells, wherein at least one of the plurality of memory cells is the cell circuit of the static memory based on the component with the current-voltage hysteresis characteristic according to claim 1.

5. The array circuit of claim 4, wherein the plurality of memory cells are arranged in a plurality of rows and a plurality of columns, the memory cells in the same row are coupled by word lines, and the memory cells in the same column are coupled by bit lines, thereby supporting write operation, read operation or proposed data maintaining operation for data information in rows or columns.

6. The array circuit of claim 5, wherein the component with the current-voltage hysteresis characteristic is a ferroelectric field effect transistor (FeFET), an anti-ferroelectric field effect transistor (Anti-FeFET), a negative-capacitance field effect transistor (NCFET), or a nanometer electromechanical relay (NEM Relay), in which, the gate of FeFET, Anti-FeFET, NCFET or NEM Relay is coupled to the write bit line through a first switch, the control signal of the first switch is coupled to the write word line, the drain of FeFET, Anti-FeFET, NCFET or NEM Relay is coupled to the read bit line through a second switch, and the control signal of the second switch is coupled to the read word line.

7. The array circuit of claim 6, wherein the first switch is implemented by the first transistor, the second switch is implemented by the second transistor, the input port of the first switch is coupled to the drain of the first transistor, the output port of the first switch is coupled to the source of the first transistor, the control signal of the first switch is coupled to the gate of the first transistor, the input port of the second switch is coupled to the drain of the second transistor, the output port of the second switch is coupled to the source of the second transistor, the control signal of the second switch is coupled to the gate of the second transistor.

8. The array circuit of claim 6, wherein the write bit line and the read bit line are coupled together through an electrical short circuit.

9. The array circuit of claim 6, wherein
when a data maintaining operation is performed, information stored in the data storage module is unchanged, the voltage of the write word line and the voltage sending from the first switch to the data storage module are controlled continuously, such that the gate voltage of the component for data storage, i.e. FeFET, Anti-FeFET, NCFET or NEM Relay, stays within the current-voltage hysteresis window, thereby avoiding the information changing.

10. The array circuit of claim 9, wherein
when the write operation is performed, the write word line drives the first switch to make the first switch conducting, and the gate voltage of the component for data storage, i.e. FeFET, Anti-FeFET, NCFET or NEM Relay, is controlled by controlling the voltage of the write bit line, thereby changing the state of the current-voltage hysteresis characteristic of the component for data storage; and
when the read operation is performed, the read word line drives the second switch to make the second switch conducting, thereby obtaining the information by the impedance characteristic of the component for data storage.

* * * * *